(12) United States Patent  (10) Patent No.: US 8,378,359 B2
Han  (45) Date of Patent: Feb. 19, 2013

(54) LIGHT EMITTING DEVICE AND METHOD OF FABRICATING THE SAME

(75) Inventor: Jae Cheon Han, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 309 days.

(21) Appl. No.: 12/741,252

(22) PCT Filed: Oct. 29, 2008

(86) PCT No.: PCT/KR2008/006386
§ 371 (c)(1),
(2), (4) Date: May 4, 2010

(87) PCT Pub. No.: WO2009/061098
PCT Pub. Date: May 14, 2009

(65) Prior Publication Data
US 2010/0230712 A1    Sep. 16, 2010

(30) Foreign Application Priority Data

Nov. 5, 2007  (KR) .................. 10-2007-0112216

(51) Int. Cl.
*H01L 27/15* (2006.01)
(52) U.S. Cl. . 257/81; 257/82; 257/E27.12; 257/E33.077
(58) Field of Classification Search ............... 257/82, 257/E27.12, E21.598, E21.532, 81, E33.077, 257/E33.052
See application file for complete search history.

(56) References Cited

U.S. PATENT DOCUMENTS

| 4,899,204 | A  | * | 2/1990  | Rosen et al. | 250/551 |
| 7,148,515 | B1 | * | 12/2006 | Huang et al. | 257/84 |
| 7,402,842 | B2 | * | 7/2008  | Goodrich     | 257/99 |
| 7,649,208 | B2 | * | 1/2010  | Lee et al.   | 257/82 |
| 2005/0253136 | A1 | * | 11/2005 | Ono et al.   | 257/40 |
| 2006/0071229 | A1 |   | 4/2006  | Guenter      |        |
| 2007/0131942 | A1 | * | 6/2007  | Yen et al.   | 257/79 |
| 2010/0193809 | A1 | * | 8/2010  | Tsai et al.  | 257/98 |

FOREIGN PATENT DOCUMENTS

| CN | 101051634 A      |   | 10/2007 |
| EP | 1587151 A2       |   | 10/2005 |
| EP | 1826834 A2       |   | 8/2007  |
| JP | 07-0717175       | * | 7/1995  |
| KR | 10-2006-0001800 A |   | 1/2006  |
| KR | 10-2006-0089324 A |   | 8/2006  |
| KR | 10-2007-0047133 A |   | 5/2007  |
| KR | 10-0757827 B1    |   | 9/2007  |
| WO | WO 2006/004337 A1 |   | 1/2006  |

* cited by examiner

OTHER PUBLICATIONS

Translation of JP07-07175, Nakaya (Jan. 10, 1995), 5 pages.*

*Primary Examiner* — Caridad Everhart
(74) *Attorney, Agent, or Firm* — Birch, Stewart, Kolasch & Birch, LLP (57) ABSTRACT

Provided are a light emitting device and a method of fabricating the same. The light emitting device comprises a first conductive type substrate, first to fourth metal electrodes, and a light emitting diode. The first conductive type substrate comprises P-N junction first to fourth diodes. The first metal electrode is connected to the first diode and the fourth diode. The second metal electrode is connected to the third diode and the second diode. The third metal electrode is connected to the first diode and the third diode. The fourth metal electrode is connected to the second diode and the fourth diode. The light emitting diode is electrically connected to the third metal electrode and the fourth metal electrode.

20 Claims, 6 Drawing Sheets

LIGHT EMITTING DEVICE AND METHOD OF FABRICATING THE SAME

TECHNICAL FIELD

Embodiments relate to a light emitting device and a method of fabricating the same.

BACKGROUND ART

A Light Emitting Diode (LED) has a light emitting source that is formed of compound semiconductor materials such as GaAs-based materials, AlGaAs-based materials, GaN-based materials, InGaN-based materials, and InGaAlP-based materials.

The LED is packaged and is used as a device that emits light of various colors. For example, the LED is used as a light source in various technical fields such as an image display device, a character display device, and an on/off display device displaying colors.

DISCLOSURE OF INVENTION

Technical Problem

Embodiments provide a light emitting device driven by Alternating Current (AC) power and a method of fabricating the same.

Embodiments provide a light emitting device comprising a bridge diode circuit with an LED and a method of fabricating the same.

Technical Solution

An embodiment provides a light emitting device comprising: a first conductive type substrate comprising P-N junction first to fourth diodes; a first metal electrode electrically connected to the first diode and the fourth diode; a second metal electrode electrically connected to the third diode and the second diode; a third metal electrode electrically connected to the first diode and the third diode; a fourth metal electrode electrically connected to the second diode and the fourth diode; and a light emitting diode electrically connected to at least one of the third metal electrode and the fourth metal electrode.

An embodiment provides a light emitting device comprising: a first conductive type substrate; a first well of a second conductive type at one side of the first conductive type substrate; a fourth and fifth wells of the second conductive type at the other side of the first conductive type substrate; a second and third wells of the first conductive type in the first well of the second conductive type; a first metal electrode electrically connected to the second well of the first conductive type and the fifth well of the second conductive type; a second metal electrode electrically connected to the third well of the first conductive type and the fourth well of the second conductive type; and a light emitting diode electrically connected to the first conductive type substrate and the first well of the second conductive type.

An embodiment provides a method of fabricating a light emitting device, comprising: forming P-N junction first to fourth diodes by doping the top of a first conductive type substrate with impurities in a well structure; forming an insulting layer on the first conductive type substrate and exposing a portion of the first to fourth diodes and the first conductive type substrate; electrically connecting a first metal electrode to the first diode and the fourth diode and electrically connecting a second metal electrode to the third diode and the second diode; and electrically connecting a light emitting diode between the first diode, the third diode, and the first conductive type substrate.

Advantageous Effects

The embodiments can drive a light emitting device by AC power.

The embodiments can provide a light emitting device having an AC bridge circuit.

The embodiments can provide a light emitting device using a bridge diode circuit having an LED.

The embodiments can provide a package of a bridge diode circuit having an LED.

The embodiments can drive a light emitting device by AC power instead of DC power without the use of an additional bridge diode circuit.

BEST MODE FOR CARRYING OUT THE INVENTION

Reference will now be made in detail to the embodiments of the present disclosure, examples of which are illustrated in the accompanying drawings.

Figure 1:
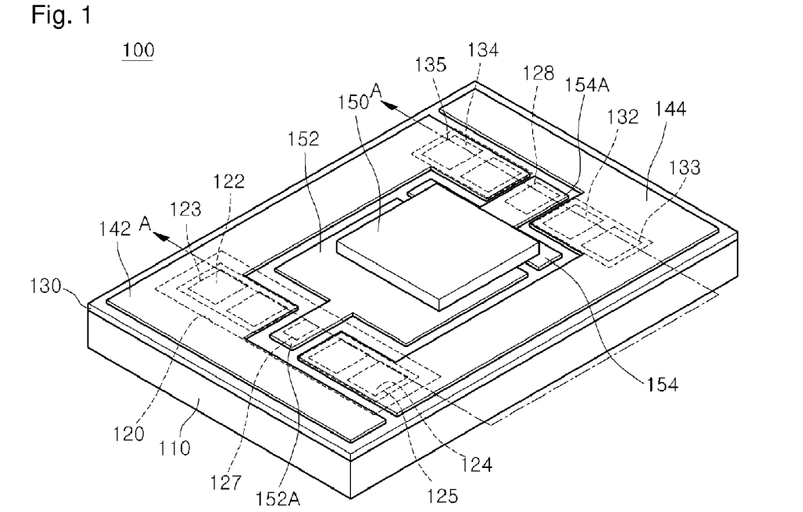
FIG. 1 is a perspective view of a light emitting device according to a first embodiment.
Figure 2:
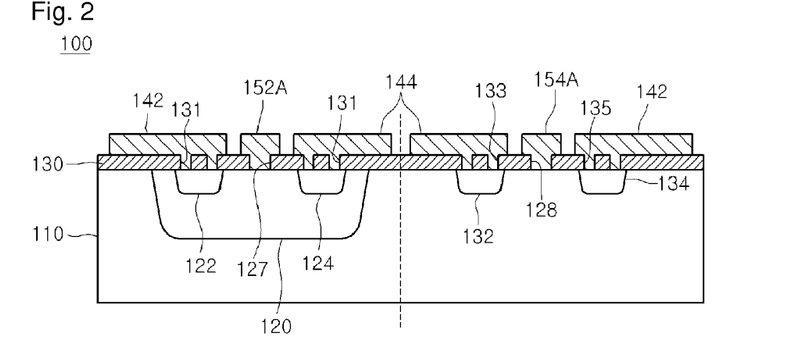
FIG. 2 is a sectional view taken along a line A-A of FIG. 1.
Figure 3:
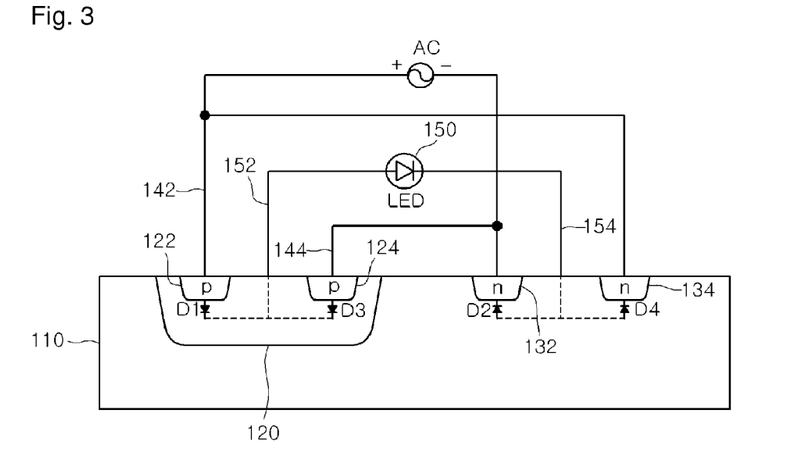
FIG. 3 is a diagram illustrating connections between metal electrodes of FIG. 1.

FIG. 1 is a perspective view of a light emitting device according to a first embodiment. FIG. 2 is a side sectional view taken along a line A-A of FIG. 1. FIG. 3 is a circuit diagram of FIG. 1.

Referring to FIGS. 1 and 2, a light emitting device 100 comprises a first conductive type substrate 110, a first well 120 of a second conductive type, a second well 122 of the first conductive type, a third well 124 of the first conductive type, a fourth well 132 of the second conductive type, a fifth well 134 of the second conductive type, an insulating layer 130, metal electrodes 142, 144, 152 and 154, and a light emitting diode (LED) 150.

The first conductive type substrate 110 may comprise a silicon substrate, for example, a P-type silicon substrate or a P-type sub mount.

The first well 120, the fourth well 132, and the fifth well 134 are formed on the first conductive type substrate 110.

The first well 120 is formed to a predetermined thickness at one side of the first conductive type substrate 110, and the fourth well 132 and the fifth well 134 are formed to a predetermined thickness at the other side of the first conductive type substrate 110. The fourth well 132 and the fifth well 134 are spaced apart from each other by a predetermined distance.

Herein, the second well 122 and the third well 124 are formed in the first well 120 and are spaced apart from each other by a predetermined distance.

The first well 120, the second well 122, the third well 124, the fourth well 132, and the fifth well 134 are formed by ion implantation to a predetermined thickness from the top surface of the first conductive type substrate 110.

Herein, the first conductive type and the second conductive type may be formed by ion-implanting P-type impurities or N-type impurities into the silicon substrate. Accordingly, the first conductive type may be formed of an N-type semiconductor doped with N-type impurities or Group 5 elements, and the second conductive type may be formed of a P-type semiconductor doped with P-type impurities or Group 3 elements. Alternatively, if the first conductive type is formed of a P-type semiconductor, the second conductive type may be formed of an N-type semiconductor. Hereinafter, the embodiment will be described on the assumption that the first conductive type has P-type semiconductor characteristics and the second conductive type has N-type semi-conductor characteristics.

The first well 120 of the second conductive type is P-N joined with the second well 122 of the first conductive type to form a first diode D1 (see FIG. 3), and the first well 120 of the second conductive type is P-N joined with the third well 124 of the first conductive type to form a second diode D3 (see FIG. 3).

The first conductive type substrate 110 is P-N joined with the fourth well 132 of the second conductive type to form a second diode D2 (see FIG. 3), and the first conductive type substrate 110 is P-N joined with the fifth well 134 of the second conductive type to form a fourth diode D4 (see FIG. 3).

The insulating layer 130 is formed on the first conductive type substrate 110, and a plurality of via holes 123, 125, 127, 128, 133 and 135 are formed in the insulating layer 130. One or more first via holes 123 are formed on the second well 122 of the first conductive type; one or more second via holes 125 are formed on the third well 124 of the first conductive type; one or more third via holes 133 are formed on the fourth well 132 of the second conductive type; one or more fourth via holes 135 are formed on the fifth well 134 of the second conductive type; the fifth via hole 127 is formed at a center portion of one side of the first well 120 of the second conductive type; and the sixth via hole 128 is formed at a center portion of the other side of the first conductive type substrate 110.

The insulating layer 130 may be formed of an insulating material or an oxide-based material such as $SiO_2$, $Si_3N_4$, $Al_2O_3$, and $TiO_2$, to which the present invention is not limited.

The metal electrodes 142, 144, 152 and 154 are formed on the insulating layer 130.

The metal electrodes 142, 144, 152 and 154 may be electrically connected to the first conductive type substrate 110 and the first to fifth wells 120, 122, 124, 132 and 134 through the via holes 123, 125, 127, 128, 133 and 135 of the insulating layer 130. The first metal electrode 142 is connected commonly to the second well 122 of the first conductive type and the fifth well 134 of the second conductive type through the first via hole 123 and the fourth via hole 135.

The second metal electrode 144 is connected commonly to the third well 124 of the first conductive type and the fourth well 132 of the second conductive type through the second via hole 125 and the third via hole 133.

The third metal electrode 152 is formed at one side of the center of the first conductive type substrate 110, and its one end 152A is connected to the first well 120 of the second conductive type and a first electrode of the LED 150 through the fifth via hole 127.

The fourth metal electrode 154 is formed at the other side of the center of the first conductive type substrate 110, and its other end 154A is connected to the first conductive type substrate 110 and a second electrode of the LED 150 through the sixth via hole 128. The first electrode may be an anode electrode, and the second electrode may be a cathode electrode.

The LED 150 may be attached by adhesive to the third metal electrode 152 and/or the fourth metal electrode 154. In this case, both electrodes of the LED 150 may be electrically connected to the third metal electrode 152 and the fourth metal electrode 154 by at least one of wire bonding, die bonding, and flip bonding. The LED 150 may be one or more of a white LED chip, a UV LED chip, and color LED chips such as a red LED chip, a green LED chip, and a blue LED chip.

Figure 4:
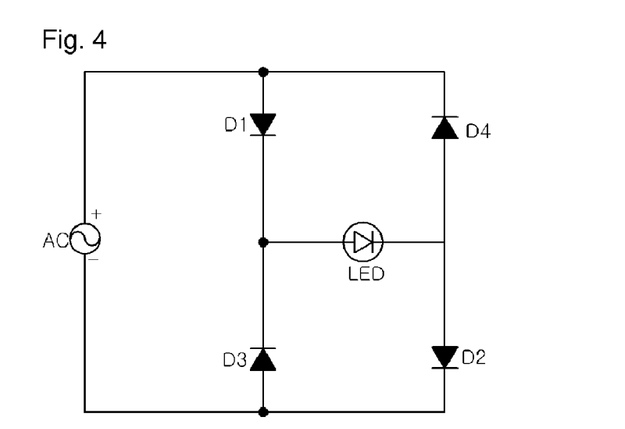
FIG. 4 is a circuit diagram of FIG. 1.

FIG. 3 is the circuit diagram of FIG. 1, and FIG. 4 is a circuit diagram of FIG. 3.

Referring to FIGS. 3 and 4, the first diode D1 is formed by a P-N junction between the second well 122 of the first conductive type and the first well 120 of the second conductive type, and the third diode D3 is formed by a P-N junction between the third well 124 of the first conductive type and the first well 120 of the second conductive type. The second diode D2 is formed by a P-N junction between the fourth well 132 of the second conductive type and the first conductive type substrate 110, and the fourth diode D4 is formed by a P-N junction between the fifth well 134 of the second conductive type and the first conductive type substrate 110.

The first metal electrode 142 is connected commonly to the anode of the first diode D1 and the cathode of the fourth diode D4; and the second metal electrode 144 is connected commonly to the anode of the third diode D3 and the cathode of the second diode D2. The third metal electrode 152 is connected commonly to the cathode of the first diode D1, the cathode of the third diode D3, and the anode of the LED 150 through the first well 120; and the fourth metal electrode 154 is connected commonly to the anode of the second diode D2, the anode of the fourth diode D4, and the cathode of the LED 150.

The first and second metal electrodes 142 and 144 are connected to both terminals of the AC power; and the first to fourth diodes D1 to D4 and the LED 150 constitutes a bridge diode circuit. That is, the LED 150 is comprised in the bridge diode circuit and is always turned on when the AC power is input thereto.

In the light emitting device, the well structure is formed on the surface of the first conductive type substrate to form the bridge diodes D1, D2, D3 and D4, and the LED 150 is mounted on the bridge diode circuit, thereby making it possible to provide a light emitting diode (LED) that can be driven by AC power.

Figure 5:
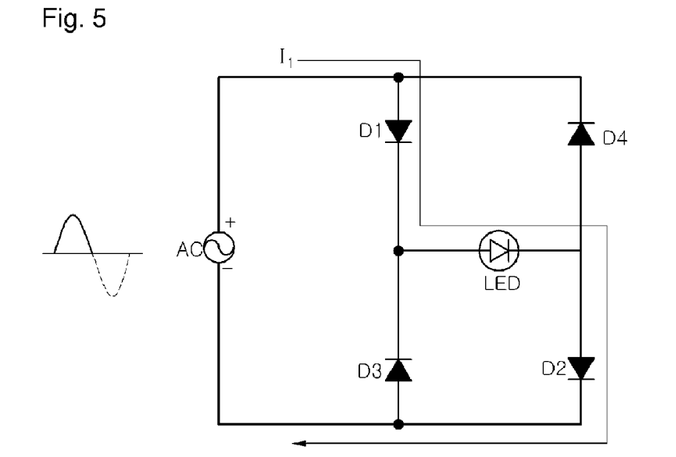
FIGS. 5 and 6 are diagrams illustrating a current path in the circuit of FIG. 4.
Figure 6:
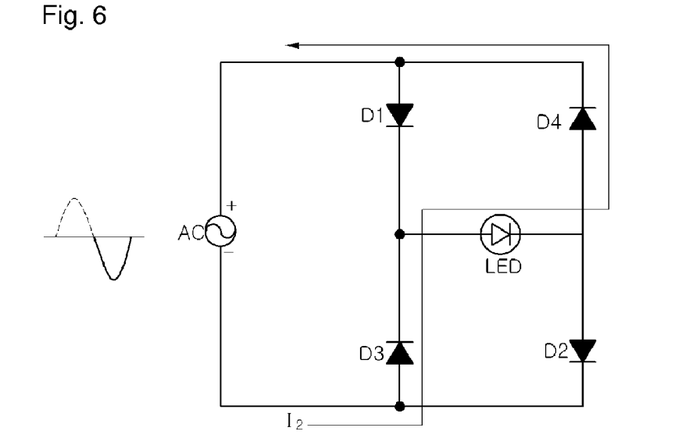

FIGS. 5 and 6 are diagrams illustrating a current path in the circuit of FIG. 4.

Referring to FIG. 5, a positive current $I_1$ of the AC power flows through the first diode D1, the light emitting diode (LED), and the second diode D2, so that the LED is turned on.

Referring to FIG. 6, a negative current $I_2$ of the AC power flows through the third diode D3, the light emitting diode (LED), and the fourth diode D4, so that the LED is turned on. Thus, the LED is always turned on by the AC power.

FIGS. 7 to 14 are views illustrating a method of fabricating a light emitting device according to a first embodiment.

Figure 7:
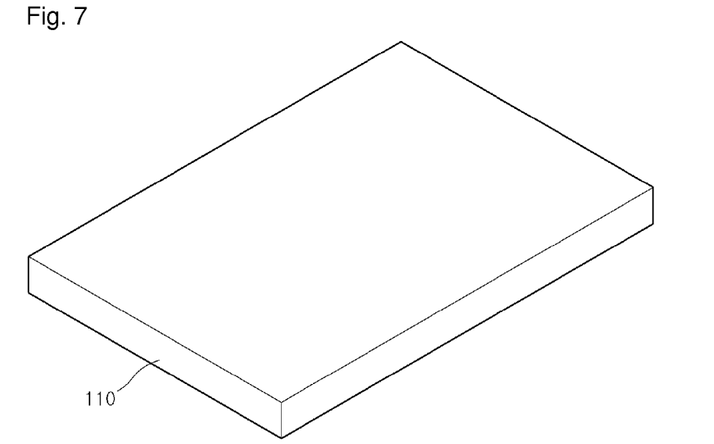
FIGS. 7 to 14 are views illustrating a method of fabricating a light emitting device according to a first embodiment.
Figure 8:
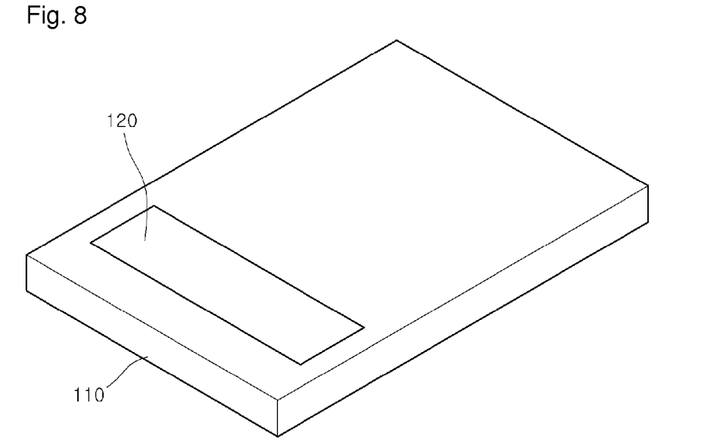

Referring to FIGS. 7 and 8, a first conductive type substrate 110 is a silicon-based P-type substrate and may be formed of a single-layer substrate or a multi-layer substrate.

Dopants of a second conductive type are ion-implanted through the surface of one side of the first conductive type substrate 110 to form a first well 120 of the second conductive type.

Figure 9:
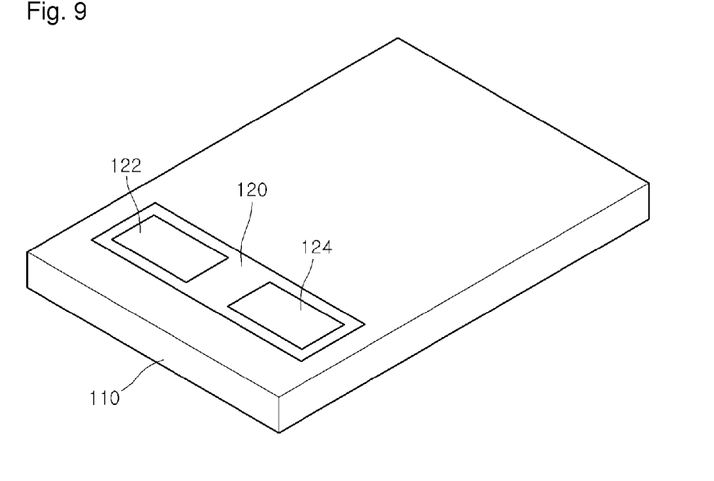
Figure 10:
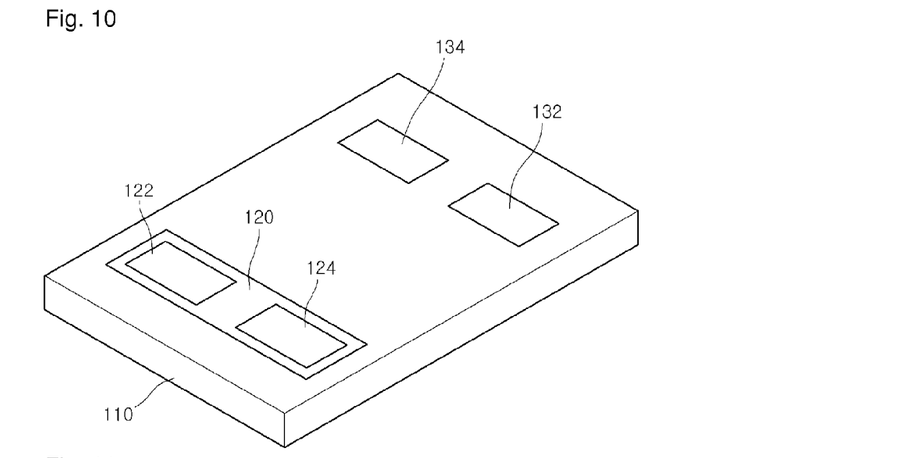

Referring to FIGS. 9 and 10, dopants of the first conductive type are ion-implanted through the surface of the first well 120 of the second conductive type of the first conductive substrate 110 to form a second well 122 of the first conductive type and a third well 124 of the first conductive type. The second well 122 and the third well 124 are formed to a predetermined depth in such a way that they are spaced apart from each other by a predetermined distance.

Dopants of the second conductive type are ion-implanted into the surface of the other side of the first conductive type substrate 110 to form a fourth well 132 of the second conductive type and a fifth well 134 of the second conductive type. The fourth well 132 and the fifth well 134 are formed to a predetermined depth in such a way that they are spaced apart from each other by a predetermined distance. The first well 120, the fourth well 132, and the fifth well 134 may be identical to or different from each other in terms of size and depth.

Conductive dopants are ion-implanted through the top surface of the first conductive type substrate 110 to form the first to fifth wells 120, 122, 124, 132 and 134, thereby forming a conductive well structure with a predetermined depth. For example, the wells 120, 132, and 134 of the second conductive type may be formed as N-type wells by selectively implanting or diffusing phosphor N-type dopants such as (P) ions and fluorine ions on the first conductive type substrate 110. The second and third wells 122 and 124 of the first conductive type may be formed as P-type wells by selectively implanting or diffusing phosphor P-type dopants such as boron ions and aluminum ions on the first conductive type substrate 110. The ion implantation process ionizes N-type or P-type dopant elements, accelerates the dopant ions by a voltage, and implants or diffuses the accelerated dopant ions into the surface of the first conductive type substrate 110, thereby making it possible to electrically control the amount or distribution of the conductive dopants.

Also, the ion implantation process for the first conductive type substrate 110 may be an ion beam implantation process or a plasma ion implantation process, to which the present invention is not limited. The order of forming the well structure of the first conductive type and the well structure of the second conductive type may vary according to embodiments, to which the present invention is not limited.

Figure 11:
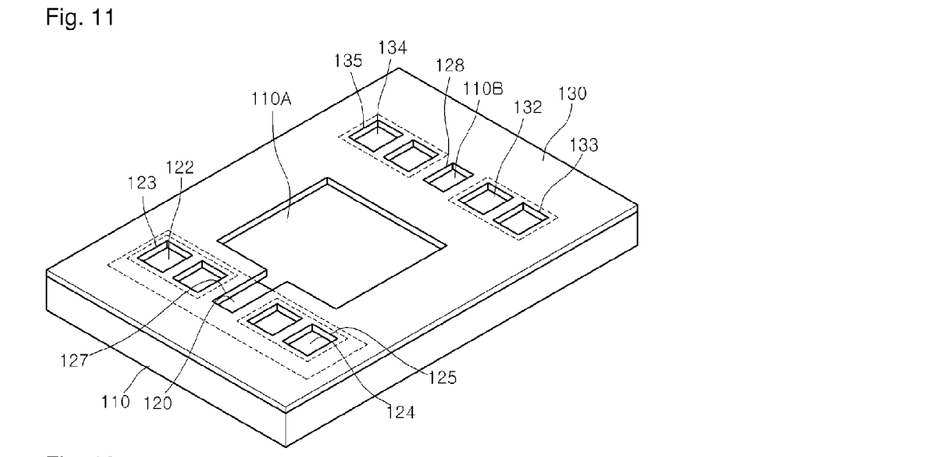

Referring to FIG. 11, an insulating layer 130 is formed on the first conductive type substrate 110. The insulating layer 130 may be formed of an insulating material or an oxide-based material such as $SiO_2$, $Si_3N_4$, $Al_2O_3$, and $TiO_2$.

A plurality of via holes 123, 125, 127, 128, 133 and 135 are formed in the insulating layer 130. At least one first via hole 123 is formed at the surface of the second well 122; at least one second via hole 125 is formed at the surface of the third well 124; at least one third via hole 133 is formed at the surface of the fourth well 132; and at least one fourth via hole 135 is formed at the surface of the fifth well 134.

Also, at least one fifth via hole 127 is formed at the surface of the first well 120, and the fifth via hole 127 is disposed between the second well 122 and the third well 124.

At least one sixth via hole 128 is formed at a surface 110B of the other side of the first conductive type substrate 110, and the sixth via hole 128 is disposed between the fourth well 132 and the fifth well 134.

Also, a center region on the first conductive type substrate 110 is an LED mounting region 110A, which may not be formed or may be formed in a via hole structure.

Figure 12:
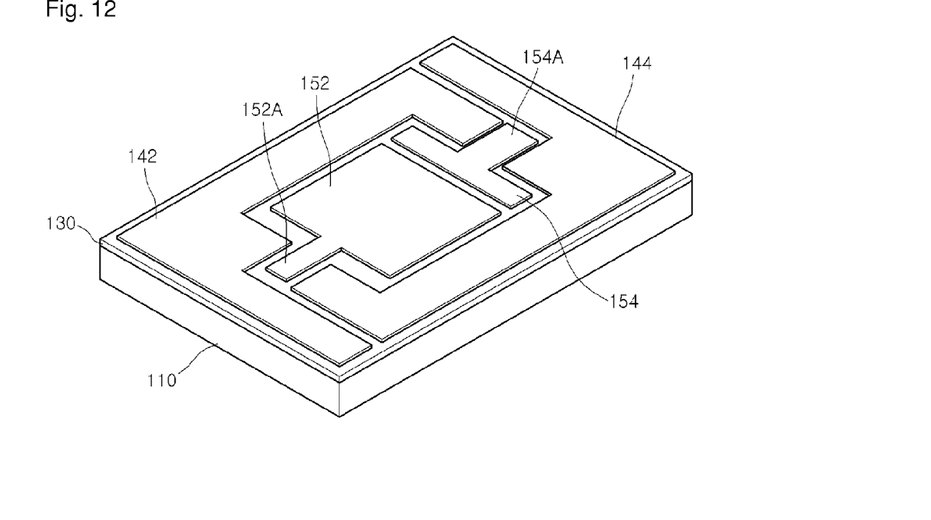
Figure 13:
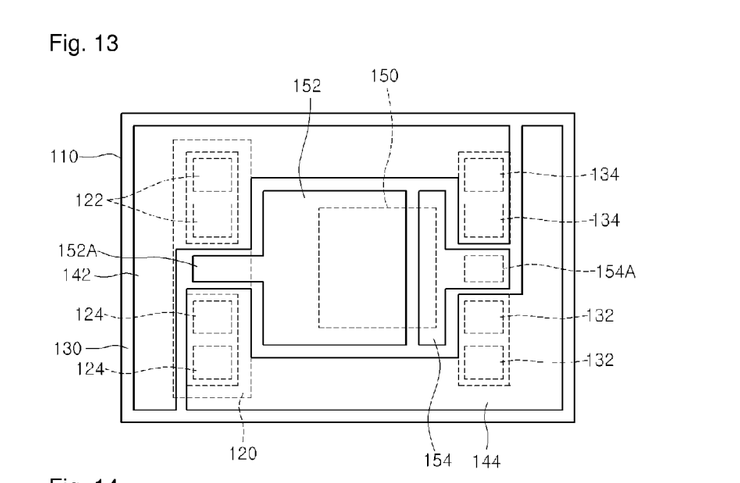

Referring to FIGS. 11 to 13, first to fourth metal electrodes 142, 144, 152 and 154 are formed on the insulating layer 130, and some of the first to fourth metal electrodes 142, 144, 152 and 154 are electrically connected through the via holes 123, 125, 127, 133 and 135 to the respective wells 120, 122, 124, 132 and 134 and the first conductive type substrate 110.

The first metal electrode 142 connects the second well 122 of the first conductive type and the fifth well 134 of the second conductive type. The second metal electrode 144 connects the third well 124 of the first conductive type and the fourth well 132 of the second conductive type. One end 152A of the third metal electrode 152 is connected to the first conductive type substrate 110, the first well 120 of the second conductive type, and the anode of an LED 150; and the other end 154A of the fourth metal electrode 154 is connected to the first conductive type substrate 110 and the cathode of the LED 150.

Figure 14:
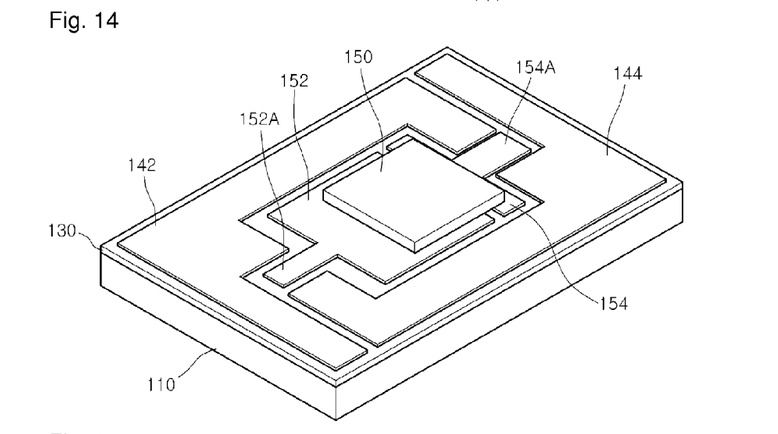

Referring to FIG. 14, the LED 150 may be attached by adhesive to the third metal electrode 152 and/or the fourth metal electrode 154. In this case, both electrodes of the LED 150 may be electrically connected to the third metal electrode 152 and the fourth metal electrode 154 by at least one of wire bonding, die bonding, and flip bonding, to which the present invention is not limited.

The light emitting device may be implemented in a circuit configuration as illustrated in FIG. 4, so that a bridge diode circuit may always turn on the LED 150 by AC power. Herein, the LED 150 is disposed on the third and/or fourth metal electrodes 152 and 154, thereby making it possible to effectively perform the electrical characteristics and the heat dissipation operation.

In order to protect the LED 150 or improve the optical efficiency, a separate convex lens (not illustrated) may be mounted on the first conductive type substrate 110.

Figure 15:
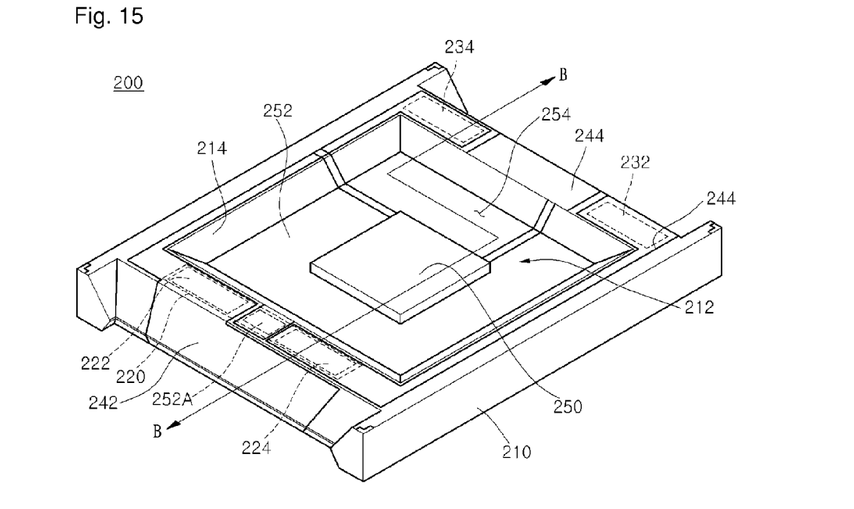
FIG. 15 is a perspective view of a light emitting device according to a second embodiment.
Figure 16:
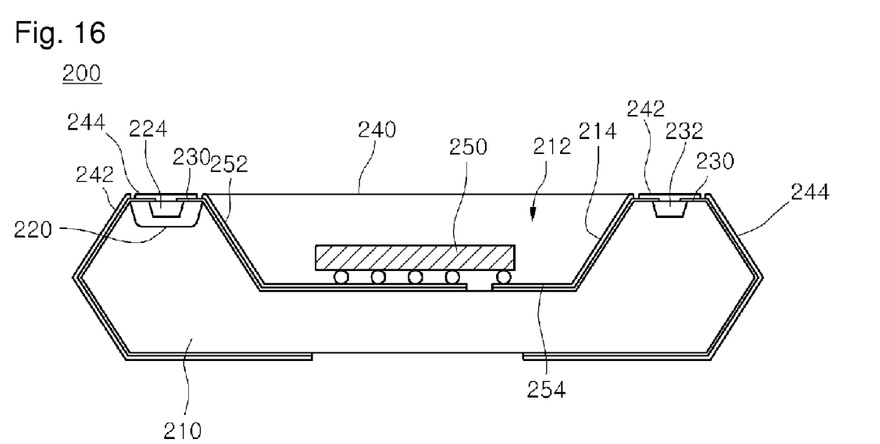
FIG. 16 is a sectional view taken along a line B-B of FIG. 15.

FIG. 15 is a perspective view of a light emitting device according to a second embodiment, and FIG. 16 is a sectional view taken along a line B-B of FIG. 15.

Referring to FIGS. 15 and 16, a light emitting device 200 comprises: a first conductive type substrate 210 with a cavity 212; a plurality of wells 220, 222, 224, 232 and 234 formed on the surface of the first conductive type substrate 210; and a light emitting diode (LED) 250 mounted on the cavity 212.

The first conductive type substrate 210 is a Wafer Level Package (WLP) and may be formed of a silicon-based wafer with the first conductive type.

The cavity 212 with a predetermined depth is formed in the top of the first conductive type substrate 210, and a side 214 of the cavity 212 may be inclined outside or perpendicular with respect to the bottom surface of the cavity 212.

The first well 220 of a second conductive type is formed at the surface of one side of the first conductive type substrate 210, that is, one side of the cavity 212, and the second well 222 of the first conductive type and the third well 224 of the first conductive type are formed in the first well 220. The second well 222 of the first conductive type, the third well 224 of the first conductive type, and the first well 220 of the second conductive type constitute a P-N junction diode.

The fourth well 232 of the second conductive type and the fifth well 234 of the second conductive type are formed at the surface of the other side of the first conductive type substrate 210, that is, the other side of the cavity 212. The fourth well 232 of the second conductive type and the fifth well 234 of the second conductive type contact the first conductive type substrate 210 to constitute a P-N junction diode.

Referring to FIG. 16, an insulating layer 230 is formed on the first conductive type substrate 210, and a plurality of via holes (not illustrated) are formed therein. The via holes may be formed as illustrated in FIG. 11, and thus their detailed description will be omitted for conciseness. The via holes expose a portion of the first conductive type substrate 210 and the wells 222, 224, 232 and 234.

A plurality of metal electrodes 242, 244, 252 and 254 are formed on the insulating layer 230. The first metal electrode 242 is connected commonly to the second well 222 of the first conductive type and the fifth well 234 of the second conductive type. The second metal electrode 244 is connected commonly to the third well 224 of the first conductive type and the fourth well 232 of the second conductive type. The third metal electrode 252 is connected commonly to the first well 220 of the second conductive type and the anode of the LED 250. The fourth metal electrode 254 is connected commonly to the first conductive type substrate 210 and the cathode of the LED 250.

One end 252A of the third metal electrode 252 is electrically connected to the first well 220 of the second conductive type through a via hole structure.

The first and second metal electrodes 242 and 244 extend to the rear side along the side of the first conductive type substrate 210, and are connected to an AC power terminal. The LED 250 is mounted on the third and fourth metal electrodes 252 and 254 in a flip bonding fashion. Accordingly, it is possible to provide a bridge diode circuit having the LED 250 as illustrated in FIG. 4.

Herein, the LED 250 may be mounted in the shape of a package of a blue LED chip, a red LED chip, a green LED chip, or a UV LED chip. Also, the cavity 212 may be filled with a resin material 240 such as epoxy or silicon, and a convex lens may be mounted on the resin material 240. Also, at least one type of fluorescent material, which excites the light emitted from the LED 250 into another spectrum, may be added to the resin material 240.

Figure 17:
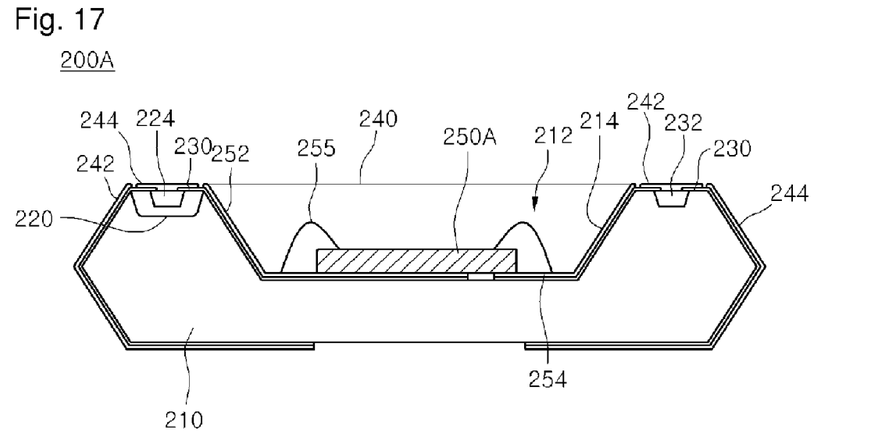
FIG. 17 is a side sectional view of a light emitting device according to a third embodiment.

FIG. 17 is a side sectional view of a light emitting device according to a third embodiment. In describing the third embodiment, like reference numerals as in the second embodiment denote like elements and thus their description will be omitted.

Referring to FIG. 17, a light emitting device 200A comprises at least one light emitting diode (LED) 250A mounted on a cavity 212 of a first conductive type substrate 210. The LED 250A is attached on a third metal electrode 252 and/or a fourth metal electrode 254, and is connected through a plurality of wires 255 to the third metal electrode 252 and the fourth metal electrode 254. A bridge diode circuit is provided around the top of the first conductive type substrate 210, and the LED 250A is driven by AC power.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments can provide a light emitting device driven by AC power.

The embodiments can provide a light emitting device that emits light of various colors.

The embodiments can be used in various technical fields such as an AC power light source, an image display device, a character display device, and an on/off display device displaying colors.

The invention claimed is:

1. A light emitting device comprising:
    a first conductive type substrate;
    a first well of a second conductive type at one side of the first conductive type substrate;
    fourth and fifth wells of the second conductive type at the other side of the first conductive type substrate;
    second and third wells of the first conductive type in the first well of the second conductive type;
    a first metal electrode electrically connected to the second well of the first conductive type and the fifth well of the second conductive type;
    a second metal electrode electrically connected to the third well of the first conductive type and the fourth well of the second conductive type; and
    a light emitting diode (LED) electrically connected to the first conductive type substrate and the first well of the second conductive type.

2. The light emitting device according to claim 1, wherein the LED comprises at least one of a color LED chip, a UV LED chip, and a white LED chip.

3. The light emitting device according to claim 1, comprising:
    a third metal electrode electrically connected to the first well of the second conductive type; and
    a fourth metal electrode electrically connected to the first conductive type substrate,
    wherein both electrodes of the LED are electrically connected to the third metal electrode and the fourth metal electrode.

4. The light emitting device according to claim 1, wherein the first conductive type substrate comprises an N-type or P-type silicon-based semiconductor substrate.

5. The light emitting device according to claim 1, wherein the first conductive type substrate comprises a cavity with a predetermined depth in a region mounted with the LED, and the first to fifth wells are formed at both sides of the cavity of the first conductive type substrate.

6. The light emitting device according to claim 1, comprising: an insulating layer disposed on the first conductive type substrate and having a plurality of via holes that are formed to selectively connect the respective wells, the first conductive type substrate, and the respective metal electrodes.

7. The light emitting device according to claim 1, wherein the first well of the second conductive type and the second and third wells of the first conductive type operate as P-N junction first and third diodes; the first conductive type substrate and the fourth and fifth wells of the second conductive type operate as P-N junction second and fourth diodes; and the first to fourth diodes and the LED operate as a bridge diode circuit by AC power.

8. A light emitting device comprising:
a substrate;
first to fourth metal electrodes spaced apart from each other on the substrate;
an insulating layer between the substrate and the first to fourth metal electrodes;
a first diode electrically connected to the first and third metal electrodes;
a second diode electrically connected to the second and fourth metal electrodes;
a third diode electrically connected to the second and third metal electrodes;
a fourth diode electrically connected to the first and fourth metal electrodes; and
a light emitting diode (LED) on at least one of the third and fourth metal electrodes,
wherein the first and second metal electrodes are disposed around the third and fourth metal electrodes,
wherein a first connection portion is disposed on a first region between the first and second metal electrodes and is protruded from the third metal electrode,
wherein a second connection portion is disposed on a second region between the first and second metal electrodes and is protruded from the fourth metal electrode, and
wherein the first connection portion is spaced apart from the second connection portion.

9. The light emitting device according to claim 8, further comprising a resin material on the light emitting diode.

10. The light emitting device according to claim 8, wherein the substrate includes a conductive material.

11. The light emitting device according to claim 8, wherein the substrate includes a silicon-based substrate.

12. The light emitting device according to claim 8, wherein the first connection portion of the third metal electrode is connected to the first and third diodes.

13. The light emitting device according to claim 12, wherein the second connection portion of the fourth metal electrode is connected to the second and fourth diodes.

14. The light emitting device according to claim 8, wherein the first metal electrode includes a first portion adjacent to the first connection portion of the third metal electrode and a second portion adjacent to the second connection portion of the fourth metal electrode.

15. The light emitting device according to claim 14, wherein the first metal electrode includes a third portion adjacent to the first connection portion of the third metal electrode and a fourth portion adjacent to the second connection portion of the fourth metal electrode.

16. The light emitting device according to claim 14, wherein the first connection portion of the third metal electrode is spaced apart from the fourth metal electrode and the second connection portion of the fourth metal electrode is spaced apart from the third metal electrode.

17. The light emitting device according to claim 14, wherein the first connection portion of the third metal electrode is disposed opposing relation to the second connection portion of the fourth metal electrode.

18. The light emitting device according to claim 8, wherein the substrate comprises a cavity,
wherein the LED is disposed in the cavity.

19. The light emitting device according to claim 18, further comprising a resin material in the cavity.

20. The light emitting device according to claim 18, wherein the first and second metal electrodes are spaced apart from the cavity.

* * * * *